(12) United States Patent
Gourlay

(10) Patent No.: US 9,077,345 B2
(45) Date of Patent: Jul. 7, 2015

(54) CAPACITIVE SENSING APPARATUS

(75) Inventor: James Gourlay, West Lothian (GB)

(73) Assignee: DESIGN LED PRODUCTS LIMITED, Livingston (GB)

( * ) Notice: Subject to any disclaimer, the term of this patent is extended or adjusted under 35 U.S.C. 154(b) by 476 days.

(21) Appl. No.: 12/990,087

(22) PCT Filed: May 8, 2009

(86) PCT No.: PCT/GB2009/001173
§ 371 (c)(1),
(2), (4) Date: Oct. 28, 2010

(87) PCT Pub. No.: WO2009/136178
PCT Pub. Date: Nov. 12, 2009

(65) Prior Publication Data
US 2011/0037728 A1    Feb. 17, 2011

(30) Foreign Application Priority Data
May 9, 2008    (GB) .................................... 0808419.6

(51) Int. Cl.
*G06F 3/044* (2006.01)
*H03K 17/96* (2006.01)
*F21V 8/00* (2006.01)

(52) U.S. Cl.
CPC ............ *H03K 17/962* (2013.01); *G02B 6/0043* (2013.01); *G02B 6/006* (2013.01); *H03K 2217/96079* (2013.01)

(58) Field of Classification Search
CPC .......... G02F 1/13338; G02F 1/133615; G02F 2001/133638; G06F 3/044; G06F 2203/04109; G06F 2203/04111; G06F 2203/04112; G02B 6/0043; G02B 6/0023; H03K 17/962
USPC ............... 345/173, 174, 104, 102; 178/18.01, 178/18.06
See application file for complete search history.

(56) References Cited

U.S. PATENT DOCUMENTS 5,341,231 A * 8/1994 Yamamoto et al. ............. 349/63
6,573,652 B1 * 6/2003 Graff et al. ..................... 313/512
(Continued)

FOREIGN PATENT DOCUMENTS

WO    2003/044957    5/2003
WO    2004/107062    12/2004
(Continued)

*Primary Examiner* — Stephen Sherman
(74) *Attorney, Agent, or Firm* — Nixon & Vanderhye P.C.

(57) ABSTRACT

A capacitive sensing apparatus is described that incorporates a light guide having a light scattering means for illumination of the apparatus. The apparatus has a capacitive sensor mounted on a substrate that provides a capacitive sensing area for generating an electric field that emanates from the apparatus. A light source is arranged in optical communication with the light scattering means via the light guide. This arrangement acts to mitigate the effects of interference between the capacitive sensor and the light source. When an opaque substrate is employed an air gap is located between the substrate and the light guide so as to provide a substantially uniform illumination across the light guide. Appropriate selection of the refractive indices of the light guide, $n_g$, and a transparent substrate, $n_s$, provides the same desired uniform illumination in alternative embodiments. The capacitive sensing apparatus finds particular application within a touch sensitive display.

37 Claims, 2 Drawing Sheets

(56) References Cited

U.S. PATENT DOCUMENTS

| | | | |
|---|---|---|---|
| 2002/0154864 A1* | 10/2002 | Yasuda et al. | 385/49 |
| 2003/0210537 A1 | 11/2003 | Engelmann | |
| 2004/0207605 A1* | 10/2004 | Mackey et al. | 345/173 |
| 2006/0187528 A1* | 8/2006 | Hagood et al. | 359/298 |
| 2007/0047887 A1 | 3/2007 | Selbrede | |
| 2008/0018575 A1* | 1/2008 | Kobayashi et al. | 345/87 |
| 2008/0047764 A1* | 2/2008 | Lee et al. | 178/18.06 |
| 2008/0129701 A1* | 6/2008 | Murakami | 345/173 |
| 2008/0266272 A1* | 10/2008 | Narayan et al. | 345/174 |

FOREIGN PATENT DOCUMENTS

| | | |
|---|---|---|
| WO | 2005/101070 | 10/2005 |
| WO | 2007/138294 | 12/2007 |

\* cited by examiner

CAPACITIVE SENSING APPARATUS

This application is the U.S. national phase of International Application No. PCT/GB2009/001173 filed May 8, 2009 which designated the U.S. and claims priority to Great Britain Application No. 0808419.6 filed May 9, 2008, the entire contents of each of which are hereby incorporated by reference.

The present invention relates to a capacitive sensing apparatus and particularly, but not exclusively, to a capacitive sensing apparatus incorporating a light guide for illumination. The capacitive sensing apparatus finds particular application within a touch sensitive display.

Touch sensitive switches are becoming a very attractive, high value-add feature in electronic products for enhanced human-machine interfaces. Some touch sensitive switches work by creating and measuring an electric field projected into the air above a sense pad and are known as capacitive switches. Electric field signals from a specially designed microchip are carried across a circuit board and projected out above the circuit board from a capacitive sensor pad. An object, such as a finger, disturbing the electrical field above the sensor pad, is registered by measurement in the microchip, and this sensing of the presence of an object provides touch-free or very light-touch actuation function. One of the limitations of the capacitive switching approach is that there is no direct user feedback that actuation has occurred—like the "click" of a mechanical switch. Therefore, system level approaches to providing user feedback on actuation and switch state are usually needed. One approach to indicating actuation and state is to use light. The illumination and colour change of a graphic icon is usually the preferred and the most attractive solution.

One of the technical challenges with the design of systems incorporating capacitive switches is putting light on or around the sensor pad region. This is because electrical tracking and signals can interfere with the capacitive sensing fields. For example, putting high voltage AC (alternating current) fields which drive electroluminescent films beside the sense pad is problematic. The conventional approach is to produce transparent capacitive sensing pads on a substrate, from material such as ITO (Indium Tin Oxide), and then backlight the switch from the rear. A light source can be used behind the transparent electrode to shine through and illuminate the capacitive switch area.

Using transparent capacitive sensing pads adds cost and difficulty in electrically and mechanically connecting the transparent pads on the separate substrate, to the capacitive sensor chip mounted on conventional printed circuit boards.

The terms transparent and opaque refer to the optical properties of a component of the capacitive sensing apparatus at the wavelength of the light generated by the light source contained within the apparatus.

SUMMARY OF INVENTION

According to a first aspect of the present invention there is provided a capacitive sensing apparatus comprising:
   a capacitive sensor that provides a means for generating a capacitive sensing field from a capacitive sensing area;
   a light source; and
   a light guide comprising a light scattering means,
wherein the light source is spaced apart from the capacitive sensing area and the light guide is arranged to guide light from the light source to the light scattering means, the light scattering means being positioned substantially at the capacitive sensing area.

By arranging the light source to be spaced apart from the capacitive sensing area mitigates the interference effects between with the light source and the capacitive sensing field.

Preferably, the light guide is arranged to substantially transmit light from the light source by internal reflections within the light guide.

Most preferably the light source is mounted on a first surface of a substrate.

Optionally, the light guide comprises an opening for receiving the light source.

Preferably, the light guide comprises a transparent plastic injection moulded or machined light guide.

Preferably, the light source is a side or edge emitting light source.

Preferably, the light source is a light emitting diode.

Preferably, the light scattering means comprises an injection moulded, micro moulded, embossed or printed light scattering means.

Preferably, the light scattering means is white or, alternatively, transparent.

Preferably, a printed graphic layer is provided on a first surface of the light guide from which the generated capacitive sensing field exits the apparatus. The printed graphic layer is preferably a sheet of acrylic, polyester, polycarbonate or other plastic with ink on one or more surface.

Preferably, the apparatus contains a plurality of capacitive sensors, each assigned for a particular key or switch function.

Optionally the apparatus contains a plurality of light guides for guiding light from a plurality of light sources independently to each capacitive sensing area of the plurality of capacitive sensors.

Preferably, a light separator is employed to separate each capacitive sensing area. This arrangement is employed to create a segmented touch sensitive display.

Preferably, the light separator is a cavity feature which may be made of an opaque polymer, such as polyester.

Optionally, the substrate comprises an opaque substrate. In these embodiments it is preferable for the light guide to be positioned upon the opaque substrate such that an air gap is present between the opaque substrate and the light guide.

Optionally the air gap has a thickness less than or equal to 0.1 mm.

The opaque substrate may comprise a printed circuit board. Optionally the printed circuit board comprises a FR4 (Flame Retardant 4) printed circuit board.

Alternatively, a cladding layer is located between the lightguide and the opaque substrate the cladding layer having a lower refractive index that the material forming the light guide.

Optionally the cladding layer has a thickness less than or equal to 0.1 mm.

The incorporation of an air gap and/or the cladding layer provides for substantially uniform illumination of the light guide by the light source.

Preferably the capacitive sensing area is also located on the first surface of the opaque substrate.

Preferably the light scattering means is located on a second surface the second surface of the light guide, the second surface being opposite the first surface of the light guide.

Alternatively, the substrate comprises a transparent substrate. In this embodiment it is preferable for the refractive index $n_s$ of the transparent substrate is greater than or equal to the refractive index $n_g$ of the light guide. By arranging the refractive indices $n_s$ and $n_g$ in this manner provides for substantially uniform illumination of the light guide by the light source.

Preferably the light source, the light guide and the transparent substrate are arranged to form an integrated light guide.

Optionally the capacitive sensing area is located on a second surface of the transparent substrate, the second surface being opposite the first surface of the transparent substrate.

Optionally the capacitive sensing area comprises a transparent electrode. Preferably the transparent electrode is located on the first surface of the transparent substrate. In this embodiment the transparent electrode may form part of the integrated light guide.

Alternatively, the transparent electrode is located on the first surface of the transparent substrate.

Preferably the light scattering means is located on the second surface of the transparent substrate.

Optionally, the light scattering means is integrated with the capacitive sensing means on the second surface of the transparent substrate.

According to a second aspect of the present invention there is provided a touch sensitive display comprising a capacitive sensing apparatus according to the first aspect of the present invention.

According to a third aspect of the present invention there is provided a capacitive sensing apparatus comprising:
- a capacitive sensor that provides a means for generating a capacitive sensing field from a capacitive sensing area;
- a light source;
- a light guide comprising a light scattering means; and
- an opaque substrate, wherein the light source is spaced apart from the capacitive sensing area and the light guide is arranged to guide light from the light source to the light scattering means, the light scattering means being positioned substantially at the capacitive sensing area and the light guide is positioned upon the opaque substrate such that an air gap is present between the opaque substrate and the light guide.

Embodiments of the third aspect of the invention may comprise the preferred or optional features of the first aspect of the invention or vice versa.

According to a fourth aspect of the present invention there is provided a capacitive sensing apparatus comprising:
- a capacitive sensor that provides a means for generating a capacitive sensing field from a capacitive sensing area;
- a light source;
- a light guide comprising a light scattering means; and
- a transparent substrate, wherein the light source is spaced apart from the capacitive sensing area and the light guide is arranged to guide light from the light source to the light scattering means, the light scattering means being positioned substantially at the capacitive sensing area and the refractive index $n_s$ of the transparent substrate is greater than or equal to the refractive index $n_g$ of the light guide.

Embodiments of the fourth aspect of the invention may comprise the preferred or optional features of the first aspect of the invention or vice versa.

BRIEF DESCRIPTION OF DRAWINGS

Aspects and advantages of the present invention will become apparent upon reading the following detailed description of example embodiments and upon reference to the following drawings in which.

Figure 1:
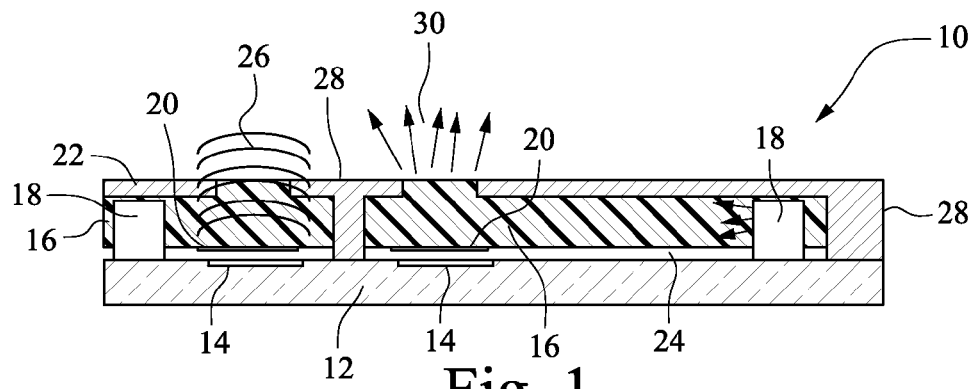
FIG. 1 presents a side elevation of a capacitive sensing apparatus in accordance with an embodiment of the present invention.

In the description which follows, like parts are marked throughout the specification and drawings with the same reference numerals. The drawings are not necessarily to scale and the proportions of certain parts have been exaggerated to better illustrate details and features of embodiments of the invention.

DETAILED DESCRIPTION

A capacitive sensing apparatus of the present invention locates a light source on top of a capacitive sensing pad or area. However, as capacitive switching is based on projecting electrical fields above the capacitive sensing pad, any light source power connections would interfere with the projected electrical fields and disturb the sensing operation if placed directly on top. This is particularly true for electroluminescent films within which the light is generated in a phosphor film and where alternating current signals in the region of 100V are present.

The present invention solves this problem by providing a light guide from a uniform light source over the general area of a capacitive sensing field. A number of light guiding devices are known to those skilled in the art. These devices are employed for a range of functions including illumination, backlighting, signage and display purposes. Typically, the devices are constructed from an injection moulded or machined transparent plastic component, where a light source, such as a fluorescent lamp or a plurality of LEDs, is integrated by means of mechanical attachment at the edge of the transparent plastic component. Examples of such devices are provided by the applicants within PCT Publication Number WO2005/101070.

Referring to FIG. 1, a capacitive sensing apparatus 10 is shown comprising an opaque substrate 12 in the form of a printed circuit, a capacitive sensor 14 and a light source 18 both mounted on a first surface of the opaque substrate 12, a light guide 16, a printed graphic layer 22 located on a first surface of the light guide 16 and a light scattering means 20 located on a second surface of the light guide 16. The capacitive sensing apparatus 10 of FIG. 1 may comprise a section of a touch sensitive display. The substrate 12, the light guide 16 and the printed graphic layer are all substantially planar.

The capacitive sensor 14 in the presently described embodiment comprises a capacitive sensing pad connected to other relevant capacitive sensing electronics via tracks located on the first surface of the opaque substrate 12. The capacitive sensing pad is typically around 0.1 mm thick and made of metal, such as 10 copper, and is located on top of a circuit board, which in this example is the substrate 12. The circuit board is typically made of FR4 (Flame Retardant 4) or kapton and is 0.1 mm to 2 mm thick. In the presently described embodiment, there is no requirement for the substrate 12 to be transparent or have apertures contained within, to let light through from behind the substrate.

An air gap 24 of typically less than 0.1 mm is arranged between the capacitive sensing pad 14 and the light guide 16. The air gap 24 prevents circuitry on the first surface of the opaque substrate 12, or adhesives and the like that are commonly employed by those skilled in the art to bond substrates, from interfering with the light transmission in the light-guide 16. As a result light generated by the light source 18 propagates efficiently through the light-guide 16, as described in further detail below, and so the illumination across the light-guide 16, and hence the capacitive sensing pad 14, is substantially uniform.

Alternatively, a low refractive index cladding material can be located between the capacitive sensing pad 14 and surrounding circuit board area, and the light guide 16. This cladding material may join the layers mechanically together but not optically. If the refractive index difference between the light guide and the cladding layer is sufficient (typically >0.1), the guiding of light within the light guide is not disturbed by the capacitive sensing pad and surrounding surface area, and total internal reflection condition for a large portion of the light is maintained. In these circumstances only the light scattering means 20 disturb the guided light. It is preferable for the cladding layer to have a thickness less than or equal to 0.1 mm.

A capacitive sensing field 26 emanates from the capacitive sensing pad 14, through the light guide 16 and the printed graphic layer 22. The capacitive sensing field 26 is an electric field, generated by the capacitive sensing pad 14. An object which enters the capacitive sensing field 26 produces a detectable change in that field, which is typically a change in dielectric constant of the capacitive sensing pad 14.

The light source 18 is preferably a side or edge emitting light and typically an LED, such as a Stanley TW1145 LED. Preferably, the light source 18 slots into appropriate openings, such as apertures or recesses, in the light guide 16. The light guide 16 comprises a material (e.g. acrylic or polycarbonate) that exhibits a refractive index $n_g$ (e.g. 1.51) that is greater than the refractive index of air $n_a$, or if present a cladding layer, and so transmits light from the light source 18 across the plane of the circuit board to the capacitive sense pad location using, in this example, the principles of total internal reflection. The light scattering means 20 is located on the second surface of the light-guide 16, above the capacitive sensing pad 14, and is typically a white or transparent injection moulded, micro-moulded, embossed or a printed surface optical feature. The light scattering means 20 disturbs the total internal reflection of the light within the light guide 16 such that the light exits via translucent or transparent sections of the printed graphic layer 22.

A light separator 28, which in this case is a cavity layer feature, optically isolates the different capacitive sensing pads 14 and corresponding light guides 16. These cavity layer features, in this example, are typically less than 1 mm thick, a comparable thickness to the height of the light source 18, and may be made from polyester or other opaque polymer. The printed graphic layer 22 may contain icons which are illuminated by the emitted light 30.

The printed graphic layer 22 is typically a transparent polymer sheet of acrylic, polyester, polycarbonate or the polymer of less than 0.1 mm thickness with a printed ink layer forming a graphic or icon pattern. The printed ink layer can be opaque, which means that where no ink has been printed light 30 is emitted through the printed graphic layer 22. The printed graphic layer 22 may be partially transparent also and, in this case, the colour of the emitted light 30 can be influenced by the colour of ink printed on the printed graphic layer 22. Typical luminance through the printed graphic layer 22 is in the order of 10 Cd/m2 to 10000 Cd/m$^2$.

It is also found to be beneficial to the visual appearance of the capacitive sensing apparatus 10 for a coloured, or white reflecting ink, to be present on the surface of capacitive sensing pads 14 i.e. located between the capacitive sensing pads 14 and the light guide 16. For the reasons detailed above it is important that this reflecting layer does not make physical contact with the light guide 16 so preserving the air gap 24.

Figure 2:
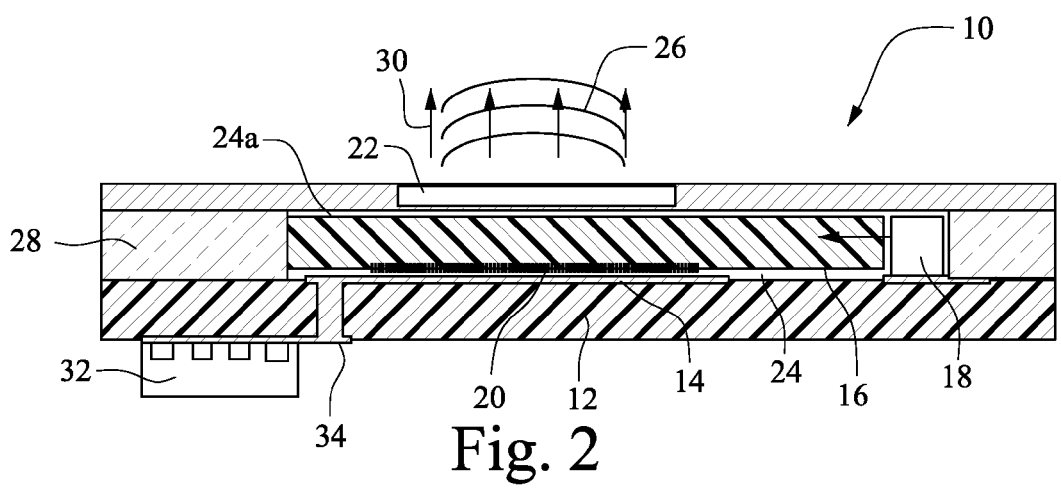
FIG. 2 presents a side elevation of a capacitive sensing apparatus that incorporates a double sided opaque substrate in accordance with an embodiment of the present invention.

FIG. 2 presents a further embodiment of a capacitive sensing apparatus 10 comprising, as before, a capacitive sensing pad 14 on a first surface of an opaque substrate 12, a light source 18 side coupled to a light guide 16 that is also located on the first surface of the opaque substrate 12, a light scattering means 20 located on the second surface of the light guide 16, a light separator 28, a printed graphic layer 22 on the first surface of the light guide 16 and an air gap 24 between the top of the capacitive sensing pad 14 and the bottom of the light-guide 16.

In this example, the capacitive sensor of the capacitive sensing apparatus 10 comprises the capacitive sensing pad 14 and a capacitive sensing chip 32, such as those supplied by Quantum Research Group, Cypress Semiconductor or Freescale Semiconductor. The capacitive sensing chip 32 is located on the second surface of the opaque substrate 12 and is connected to the capacitive sensing pad 14 via a through-hole connection 34 from one side of the opaque substrate 12 to the other.

The operation of the capacitive sensing apparatus 10 presented in FIG. 2 is similar to that described above in connection with the embodiment of FIG. 1. Again the capacitive sensing field 26 from the capacitive sensing pad 14, and light 30 from the light scattering means 20, are arranged to exit through the printed graphic layer 22. It is noted that an air gap 24b is also present between the light-guide 16 and the printed graphic layer 22 so as to further improve the uniformity of the illumination from the light source 18 across the length of the light-guide 16.

Figure 3:
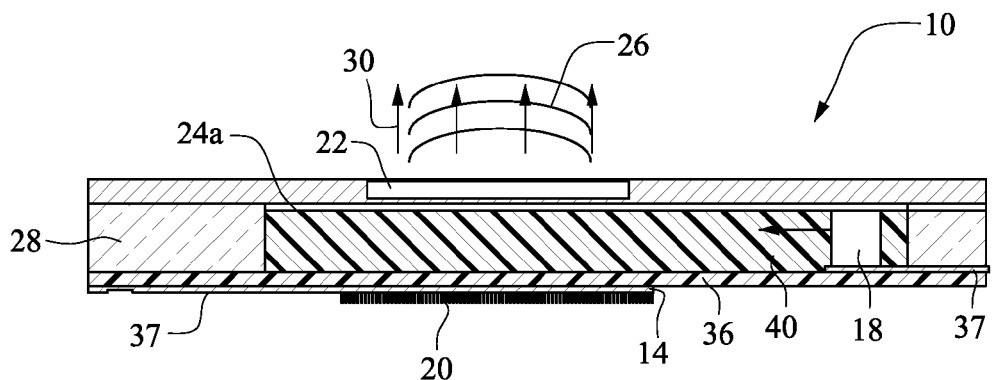
FIG. 3 presents a side elevation of a capacitive sensing apparatus incorporates a transparent substrate in accordance with an embodiment of the present invention.

FIG. 3 presents a further embodiment of the capacitive sensing apparatus 10 where a transparent substrate 36 is used to mount the electrical tracks 37 required for the capacitive sensing pad 14 and the light source 18. This is achieved by printing the required electrical tracking 37 onto the transparent substrate 36. In the presently described embodiment the light source 18 is located on a first surface of the transparent substrate 36 while the capacitive sensor 14 and the light scattering means 20 are located on a second, opposing surface of the transparent substrate 36.

In order to maintain the uniformity of the illumination from the light source 18 across the length of the light guide 16 it is preferable for the refractive index $n_s$ of the transparent substrate 36 to be greater than or equal to the refractive index $n_g$ of the light guide. For example, the transparent substrate 36 may comprise a polyester or polycarbonate film around 0.1 mm thick, having a refractive index $n_s$~1.5 to 1.6.

In the presently described embodiment, the light scattering means 20 and capacitive sensing pad 14 are combined and are located at the same position on the second surface of the transparent substrate 36. With this configuration, an air gap or cladding layer is not required to stop the circuitry on the substrate 36 interfering with light in the light guide 16, as referred to above. Furthermore, an integrated light guide 40 can now be employed wherein the integrated light guide 40 comprises the transparent substrate 36 upon the first surface 44 of which is mounted the light source 18, and the light guide 16 arranged to encapsulate the light source 18 upon this first surface. Employing an integrated light guide 40 provides enhanced mechanical protection for the light source 18 while enhancing the optical coupling of the light into the light guide 16.

Figure 4:
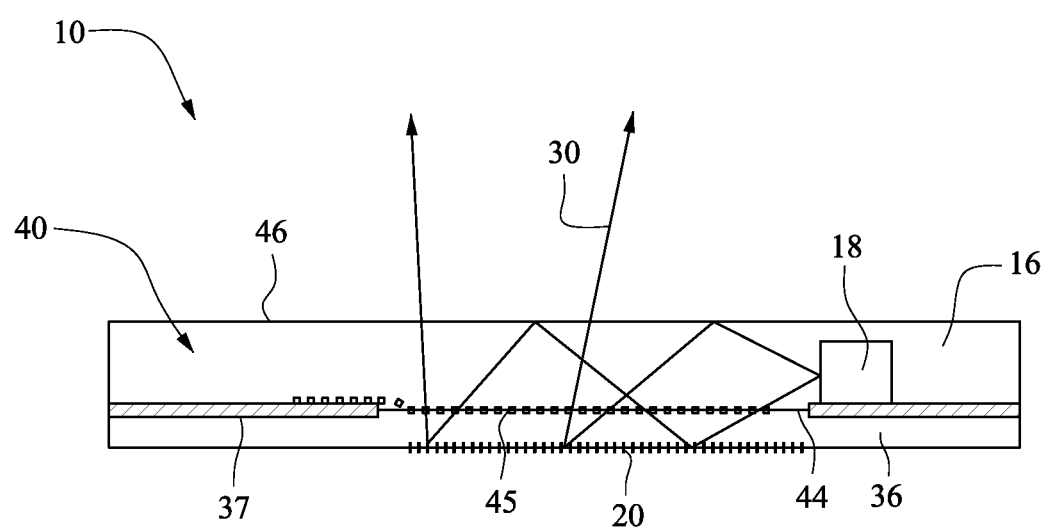
FIG. 4 presents a side elevation of an alternative embodiment of the capacitive sensing apparatus that incorporates a transparent substrate.

FIG. 4 presents a side elevation of an alternative embodiment of the capacitive sensing apparatus 10 that also incorporates an integrated light guide 40. In this embodiment the capacitive sensor 14 comprises a transparent electrode 45 that is connected to a non transparent electrical tracking 37 that has been printed on the first surface 44 of the transparent substrate 36. The light source 18 is also located on the first surface 44 and is connected to a second section of transparent electrical tracking 37. In the presently described embodiment the light guide 16 is now arranged to encapsulate both the light source 18 and at least the transparent electrode 45 of the capacitive sensor 14 upon this first surface 44. In order to maintain the uniformity of the illumination from the light source 18 across the length of the light guide 16 it is again preferable for the refractive index $n_s$ of the transparent substrate 36 to be greater than or equal to the refractive index $n_g$ of the light guide 16.

The transparent electrode 45 may comprise Indium Tin Oxide or other transparent printed inks such as those supplied by Sumitomo Metal Mining Co., Ltd or a conducting polymer, such as PEDOT. The non-transparent electrical tracking 37 may comprise a metal, such as copper or silver, or a conducting ink (polymer matrix with metal particles) such as 26-8204 from Sun Chemical.

The design of the capacitive sensing apparatus 10 shown in FIG. 4 is such that the transparent electrode 45 is located within the cross sectional area of the light 30 exiting the apparatus while the light scattering means 20 is located on the external surface of the transparent substrate 36. Since the electrode 45 is transparent its structure will not interfere with the light transmission through the combined structure of the light-guide 16 and the transparent substrate 36, and so this is again substantially uniform across the light guide 16, but will provide the electrical structure needed to deliver the capacitive field 26.

It is advantageous in simplifying the manufacturing process of the capacitive sensing apparatus 10 that the electrical tracking 37 for both the light source 18 and the capacitive sensor 14 is on a common surface of the device, as described above. It will however be recognised by those skilled in the art that the transparent electrode 45 may alternatively be located on the first surface 46 of the light guide 16 without detracting from the operation of the apparatus.

The major benefit of a capacitive sensing apparatus with a light-guide means as described herein is that the delivery of the light by the printed light-guides to the icon areas keeps the electrical signals to the light 10 source away from the capacitive sensing pads and avoids electrical interference.

The incorporation of the air gap or cladding layer in some embodiments and the transparent substrate in other embodiments is advantageous for the light to propagate along the length of the light guide and so maintain the uniformity of the illumination from the light source 18 across the length of the device. As a result the light emitted from the device appears substantially uniform to the observer.

A capacitive sensing apparatus as described herein gives enormous design freedom and design capability for attractive and high value solutions. For example, capacitive switch based sliders can be constructed with attractive continuous colour changing rainbow effects. The device structure is robust and low-cost, with very low tooling requirements. This approach can be deployed in a wide range of applications in consumer electronic, domestic appliance, automotive, medical and industrial interface products. A capacitive sensing apparatus as described herein uses light-guides to integrate conventional LEDs or other light sources, enabling thin panels with a segmented light display. By locating the light above the capacitive sensing pads with the light-source and associated electrical connections spaced apart from the capacitive sensing pads, a more cost effective and attractive display is created, which can be less than 1 mm thick. Furthermore, the design has greater optically efficiency and can connect to a conventional rigid FR4 PCB located elsewhere in the product.

The foregoing description of the invention has been presented for purposes of illustration and description and is not intended to be exhaustive or to limit the invention to the precise form disclosed. The described embodiments were chosen and described in order to best explain the principles of the invention and its practical application to thereby enable others skilled in the art to best utilise the invention in various embodiments and with various modifications as are suited to the particular use contemplated. Therefore, further modifications or improvements may be incorporated without departing from the scope of the invention as defined by the appended claims.

The invention claimed is:

1. A capacitive sensing apparatus comprising:
   a capacitive sensor located on a first surface of a substrate, the capacitive sensor providing a means for generating a capacitive sensing field from a capacitive sensing area;
   a light source; and
   a light guide comprising a light scattering means and arranged so as to locate the capacitive sensor between the substrate and the light guide,
   wherein the light source is spaced apart from the capacitive sensing area and the light guide is arranged to guide light from the light source to the light scattering means, the light scattering means being positioned substantially at the capacitive sensing area, and
   wherein the light guide and the substrate are arranged to form an air gap that separates the light guide from the substrate and the capacitive sensor, the air gap being continuous between the spaced apart light source and the capacitive sensing area.

2. A capacitive sensing apparatus as claimed in claim 1 wherein the light guide is arranged to substantially transmit light from the light source by internal reflections within the light guide.

3. A capacitive sensing apparatus as claimed in claim 1 wherein the light source is mounted on the first surface of the substrate.

4. A capacitive sensing apparatus as claimed in claim 3 wherein the substrate comprises an opaque substrate.

5. A capacitive sensing apparatus as claimed in claim 4 wherein the light guide is positioned upon the opaque substrate such that an air gap is present between the opaque substrate and the light guide.

6. A capacitive sensing apparatus as claimed in claim 5 wherein the air gap has a thickness less than or equal to 0.1 mm.

7. A capacitive sensing apparatus as claimed in claim 4 wherein a cladding layer is located between the light guide and the opaque substrate the cladding layer having a lower refractive index that the material forming the light guide.

8. A capacitive sensing apparatus as claimed in claim 7 wherein the cladding layer has a thickness less than or equal to 0.1 mm.

9. A capacitive sensing apparatus as claimed in claim 4 wherein the opaque substrate comprises a printed circuit board.

10. A capacitive sensing apparatus as claimed in claim 9 wherein the printed circuit board comprises a flame retardant printed circuit board.

11. A capacitive sensing apparatus as claimed in claim 4 wherein the capacitive sensing area is also located on the first surface of the opaque substrate.

12. A capacitive sensing apparatus as claimed in claim 4 wherein the light scattering means is located on a surface of the light guide that faces the substrate.

13. A capacitive sensing apparatus as claimed in claim 3 wherein the substrate comprises a transparent substrate.

14. A capacitive sensing apparatus as claimed in claim 13 wherein the refractive index $n_s$ of the transparent substrate is greater than or equal to the refractive index $n_g$ of the light guide.

15. A capacitive sensing apparatus as claimed in claim 13 wherein the light source, the light guide and the transparent substrate are arranged to form an integrated light guide.

16. A capacitive sensing apparatus as claimed in claim 13 wherein the capacitive sensing area is located on a second surface of the transparent substrate, the second surface being opposite the first surface of the transparent substrate.

17. A capacitive sensing apparatus as claimed in claim 13 wherein the light scattering means is located on a second surface of the transparent substrate.

18. A capacitive sensing apparatus as claimed in claim 17 wherein the light scattering means is integrated with the capacitive sensing means on the second surface of the transparent substrate.

19. A capacitive sensing apparatus as claimed in claim 1 wherein the light guide comprises an opening for receiving the light source.

20. A capacitive sensing apparatus as claimed in claim 1 wherein the light guide comprises a transparent plastic injection moulded or machined light guide.

21. A capacitive sensing apparatus as claimed in claim 1 wherein the light source is a side or edge emitting light source.

22. A capacitive sensing apparatus as claimed in claim 1 wherein the light source is a light emitting diode.

23. A capacitive sensing apparatus as claimed in claim 1 wherein the light scattering means comprises an injection moulded, micro moulded, embossed or printed light scattering means.

24. A capacitive sensing apparatus as claimed in claim 1 wherein the light scattering means is white or, alternatively, transparent.

25. A capacitive sensing apparatus as claimed in claim 1 wherein a printed graphic layer is provided on a first surface of the light guide from which the generated capacitive sensing field exits the apparatus.

26. A capacitive sensing apparatus as claimed in claim 25 wherein the printed graphic layer comprises a sheet of acrylic, polyester, polycarbonate or other plastic with ink on one or more surface.

27. A capacitive sensing apparatus as claimed in claim 1 wherein the apparatus contains a plurality of capacitive sensors, each assigned for a particular key or switch function.

28. A capacitive sensing apparatus as claimed in claim 27 wherein the apparatus contains a plurality of light guides for guiding light from a plurality of light sources independently to each capacitive sensing area of the plurality of capacitive sensors.

29. A capacitive sensing apparatus as claimed in claim 28 wherein a light separator is employed to separate each capacitive sensing area.

30. A capacitive sensing apparatus as claimed in claim 29 wherein the light separator comprises a cavity feature.

31. A capacitive sensing apparatus as claimed in claim 30 wherein the cavity feature comprises an opaque polymer.

32. A capacitive sensing apparatus as claimed in claim 1 wherein the capacitive sensing area comprises a transparent electrode.

33. A capacitive sensing apparatus as claimed in claim 32 wherein the transparent electrode is located on a first surface of a transparent substrate.

34. A capacitive sensing apparatus as claimed in claim 33 wherein the transparent electrode forms part of an integrated light guide.

35. A capacitive sensing apparatus as claimed in claim 32 wherein the transparent electrode is located on a first surface of the light guide.

36. A touch sensitive display comprising a capacitive sensing apparatus as claimed in claim 1.

37. A capacitive sensing apparatus comprising:
a capacitive sensor located on an opaque substrate, the capacitive sensor providing a means for generating a capacitive sensing field from a capacitive sensing area;
a light source;
a light guide comprising a light scattering means; and
wherein the light source is spaced apart from the capacitive sensing area and the light guide is arranged to guide light from the light source to the light scattering means, the light scattering means being positioned substantially at the capacitive sensing area and
wherein the light guide and the opaque substrate are arranged to form an air gap that separates the light guide from the opaque substrate and the capacitive sensor, the air gap being continuous between the spaced apart light source and the capacitive sensing area.

\* \* \* \* \*